(12) United States Patent
Atkinson et al.

(10) Patent No.: US 9,311,201 B2
(45) Date of Patent: Apr. 12, 2016

(54) REAL-TIME RULE ENGINE FOR ADAPTIVE TESTING OF INTEGRATED CIRCUITS

(75) Inventors: David E. Atkinson, Jericho, VT (US); Matthew S. Grady, Burlington, VT (US); Donald L. LaCroix, Jericho, VT (US); David B. Lutton, II, Cambrige, VT (US); Bradley D. Pepper, Essex Junction, VT (US); Randolph P. Steel, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 13/591,855

(22) Filed: Aug. 22, 2012

(65) Prior Publication Data

US 2014/0059382 A1 Feb. 27, 2014

(51) Int. Cl.
*G01R 31/317* (2006.01)
*G06F 11/263* (2006.01)
*G01R 31/319* (2006.01)

(52) U.S. Cl.
CPC ........ *G06F 11/263* (2013.01); *G01R 31/31905* (2013.01); *G01R 31/31903* (2013.01); *G01R 31/31908* (2013.01)

(58) Field of Classification Search
CPC ..... G06F 11/2205; G06F 11/24; G06F 11/26; H05K 3/00; H01L 22/00; H01L 22/30; H01L 22/34; H01L 22/20; H01L 22/26; G01R 31/31903; G01R 31/31905; G01R 31/31908
USPC .................. 702/119, 120; 324/750.19, 754.01
See application file for complete search history.

(56) References Cited

U.S. PATENT DOCUMENTS

| | | | |
|---|---|---|---|
| 4,841,456 A * | 6/1989 | Hogan | |
| 5,495,578 A | 2/1996 | Rohrbaugh et al. | |
| 5,726,920 A | 3/1998 | Chen et al. | |
| 6,055,463 A | 4/2000 | Cheong et al. | |
| 6,367,041 B1 | 4/2002 | Statovici et al. | |
| 6,618,682 B2 * | 9/2003 | Bulaga et al. ................... | 702/84 |
| 6,711,514 B1 | 3/2004 | Bibbee | |
| 6,726,920 B1 | 4/2004 | Theeuwes et al. | |
| 6,748,287 B1 | 6/2004 | Hagen et al. | |
| 6,959,252 B2 | 10/2005 | Tai et al. | |
| 6,968,280 B2 | 11/2005 | Tai et al. | |
| 7,073,107 B2 | 7/2006 | Madge et al. | |

(Continued)

FOREIGN PATENT DOCUMENTS

| | | |
|---|---|---|
| EP | 1092983 A1 | 4/2001 |
| WO | WO2006035647 A1 | 4/2006 |

OTHER PUBLICATIONS

Non-Final Office Action for related U.S. Appl. No. 13/776,986, dated Apr. 6, 2015, pp. 1-19.

(Continued)

*Primary Examiner* — Joseph Schell
(74) *Attorney, Agent, or Firm* — Cantor Colburn LLP; Steven Meyers

(57) ABSTRACT

A method of testing a device is disclosed. Test data is obtained for a device testing program that tests the device. An adaptation command for testing the device is determined at an adaptive testing engine using obtained test data. The adaptation command is sent from the adaptive testing engine to a tool control application. The tool control application uses the adaptation command to control an operation related to the testing of the device.

9 Claims, 2 Drawing Sheets

(56) References Cited

U.S. PATENT DOCUMENTS

| | | |
|---|---|---|
| 7,139,672 B2 | 11/2006 | Dorough et al. |
| 7,162,386 B2 | 1/2007 | Dorough et al. |
| 7,165,004 B2 | 1/2007 | Dorough et al. |
| 7,218,984 B1 | 5/2007 | Bayat et al. |
| 7,253,650 B2 | 8/2007 | Balchiunas |
| 7,266,417 B2 | 9/2007 | Liao |
| 7,337,088 B2 | 2/2008 | Velichko et al. |
| 7,383,147 B2 | 6/2008 | Dorough et al. |
| 7,398,280 B1 * | 7/2008 | Chin et al. ............ 438/129 |
| 7,403,864 B2 * | 7/2008 | Huo et al. ............ 702/81 |
| 7,463,047 B2 | 12/2008 | Balchiunas |
| 7,573,284 B2 | 8/2009 | Balchiunas |
| 7,590,504 B2 * | 9/2009 | Chorn et al. ............ 702/119 |
| 7,676,769 B2 | 3/2010 | Chan et al. |
| 7,679,392 B2 | 3/2010 | Balog |
| 7,682,842 B2 | 3/2010 | Desineni et al. |
| 7,684,892 B2 | 3/2010 | Yuan et al. |
| 7,737,716 B2 | 6/2010 | Balog |
| 7,777,515 B2 | 8/2010 | Balog |
| 7,863,923 B2 | 1/2011 | Muradali |
| 7,917,820 B1 | 3/2011 | Pavle et al. |
| 7,969,174 B2 | 6/2011 | Balog et al. |
| 8,069,130 B2 | 11/2011 | Balog |
| 8,112,249 B2 | 2/2012 | Gurov et al. |
| 8,631,247 B2 * | 1/2014 | O'Loughlin et al. ......... 713/189 |
| 8,855,959 B2 * | 10/2014 | Johnson ............. G01R 31/2894 324/762.01 |
| 2002/0174182 A1 | 11/2002 | Wilkinson et al. |
| 2005/0229062 A1 | 10/2005 | Volkerink et al. |
| 2008/0106278 A1 | 5/2008 | Huo et al. |
| 2008/0162688 A1 | 7/2008 | Reumann et al. |
| 2012/0049881 A1 | 3/2012 | Johnson et al. |
| 2012/0112786 A1 | 5/2012 | Fox |
| 2015/0057961 A1 * | 2/2015 | Montoya ............. G06F 11/2294 702/121 |

OTHER PUBLICATIONS

Final Office Action for Related U.S. Appl. No. 13/776,986, dated Dec. 23, 2014, pp. 1-13.

Non-Final Office Action for related U.S. Appl. No. 13/776,986, dated Jul. 31, 2014, pp. 1-20.

P. Maxwell, et al., "Adaptive Test Directions," 2010 IEEE; pp. 12-16.

* cited by examiner

REAL-TIME RULE ENGINE FOR ADAPTIVE TESTING OF INTEGRATED CIRCUITS

BACKGROUND

The present disclosure relates to testing integrated circuits and, in particular, to a method of controlling a behavior of a test cell that tests integrated circuits.

The complexity of integrated circuits is constantly increasing. In order to ensure quality of these increasingly-complex circuits, integrated circuit testers have been designed to run a battery of tests on the integrated circuits during various manufacturing stages as well as on the integrated circuit as a final product. Typical integrated circuit testers run a device test program that is coupled to the integrated circuit, tests the integrated circuit and collects data from the integrated circuit in response to the test. These integrated circuit testers may further be coupled to an adaptive test engine separate from the device test program that analyzes the test data and determines an adaptive action that alters the device test program in order to optimize some aspect of the testing process. These adaptive test engines are limited to implementing adaptive actions directly related to testing the integrated circuit device.

SUMMARY

According to one embodiment, a method of testing a device includes determining an adaptation command for testing the device at an adaptive testing engine using data obtained from a device testing program that tests the device; sending the adaptation command from the adaptive testing engine to a tool control application; and using the adaptation command at tool control application to control an operation related to the testing of the device.

According to another embodiment, a method of controlling a test cell that tests a device includes: operating a device test program using a tool control application; receiving an adaptation command at the tool control application; and altering a parameter of the test cell based on the adaptation command to control the test cell.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The fore-going and other features and advantages of the disclosure are apparent from the following detailed description taken in conjunction with the accompanying drawings in which:

DETAILED DESCRIPTION

Figure 1:
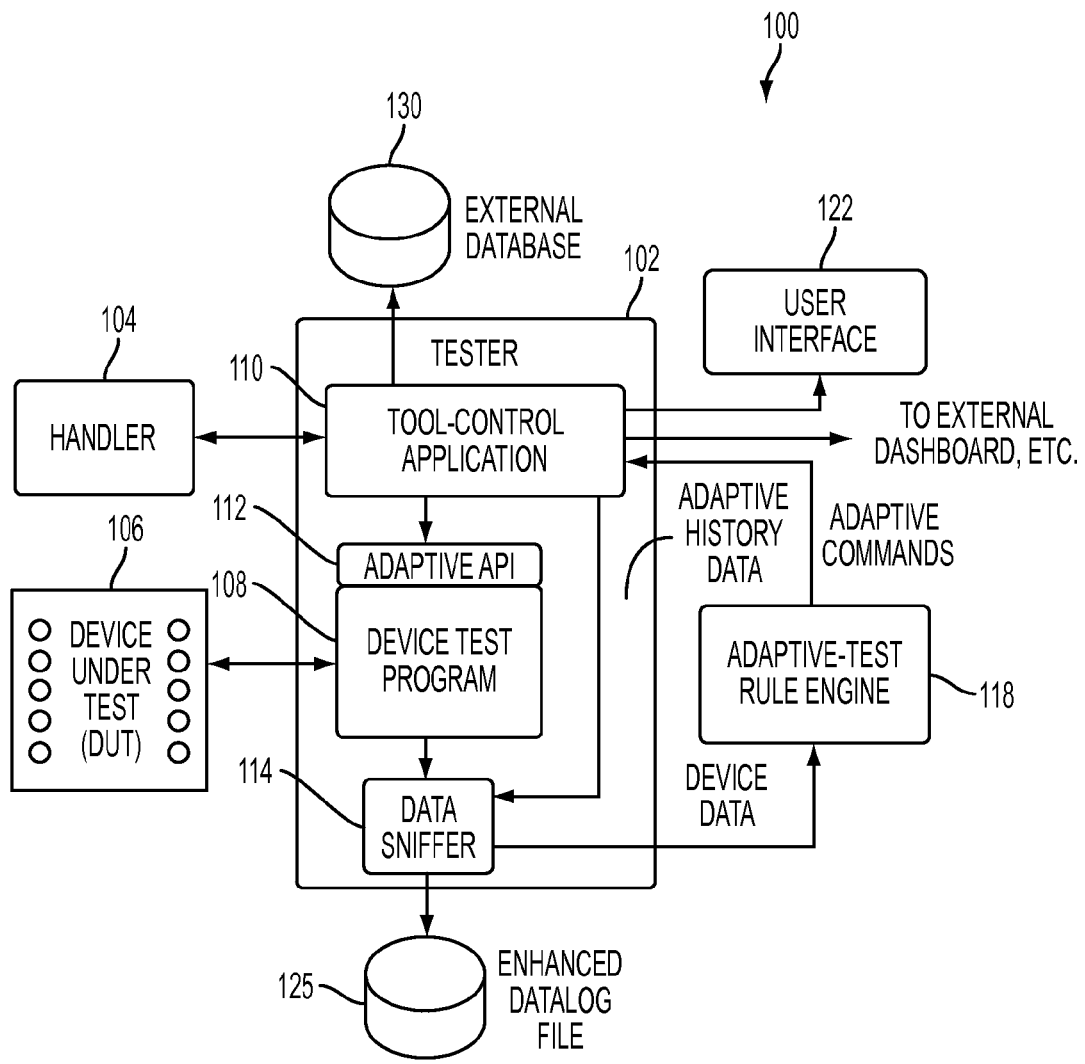
FIG. 1 shows a schematic diagram of an exemplary test cell of the present disclosure.

FIG. 1 shows a schematic diagram of an exemplary test cell 100 of the present disclosure. In various embodiments, the exemplary test cell 100 includes a tester 102 that runs various programs that perform tests on a device under test (DUT) 106 such as an integrated-circuit chip on a wafer, integrated circuit in a module package, etc. The DUT 106 is often one of a plurality of DUTs from a sample bin or sample group. The DUT 106 may have an associated part number and a group number identifying its inclusion in a given sample group. The DUT 106 may be in any stage of manufacturing, including a completed product. In an exemplary embodiment, the tester 102 selects the DUT 106 for testing by operating a handler 104. The handler 104 may include various subsystems such as wafer selector, wafer probe, probe cleaner, etc., that are used to manipulate various physical aspects of the testing process. The handler 104 may select the DUT 106 from its sample group, place the probes at the selected DUT's location on the wafer and advance to a new DUT 106 once a test is completed. In another embodiment, the handler 104 may be designed to place an integrated circuit DUT 106 into a testing socket for testing and remove the integrated circuit from the testing socket once a test is completed. The handler is controlled by the tester 102, and various parameters of the handler may be altered by the tester 102 using exemplary methods disclosed herein.

The tester 102 may include a number of programs that may be operated by one or more processors in order to perform various testing procedures disclosed herein. Exemplary programs that may be run on the one or more processors may include a device test program 108 for performing tests on the DUT 106, a tool control application 110 for providing supervision of the device test program 108 as well as for performing additional tasks related to the testing process, an adaptive API (application program interface) 112 for provided commands from the tool control application 110 to the device test program 108, and a data sniffer 114 for extracting data from the device test program 108 in real-time. In addition, a real-time adaptive-test rule engine 118 may be run on the one or more processors. In one aspect, the adaptive-test rule engine 118 receives test data from the data sniffer 114 and analyzes the data with respect to a set of rules and algorithms to determine a set of adaptation commands or directives that are then sent to the tool control application 110.

The device test program 108 administers tests to the DUT 106. In one embodiment, the device test program 108 is involved in various aspects of administering the tests including, but not limited to, sending signals to the DUT 106, receiving signals from the DUT 106 in response to the sent signals, determining a condition or pass/fail status of the DUT 106 from the received signals, and storing data to a database or data file 125. The adaptive API 112 is included in the device test program 108 and provides communication between the tool control application 110 and the device test program 108. In one embodiment, the device test program 108 may receive instructions from the tool control application 112 through the adaptive API 112. Exemplary instructions may include initiating the device test program 108 to run a test, altering a parameter of the test, and stopping or discontinuing administering of a part of a test. The exemplary instructions may be received and implemented during the testing process.

The tool control application 110 supervises the device test program 108 and controls various behaviors or activities of the test cell 100. A behavior may be an activity that is not directly related to the function of administering tests at the device test program 108. In one embodiment, the tool control application 110 may communicate data such as test results to a user interface 122. The user interface 122 may provide a data display to an operator and allow for operator input. In various embodiments, the tool control application 110 may pause the device testing program 108 until the operator provides an input, generally via the user interface 122. In another embodiment, the tool control application 110 may control various peripherals, such as handler 104, for handling the DUT 106 and other handler operations. The tool control application 110 may control the handler 104 to place a DUT 106 into a testing position within the test cell 100, clean a probe, position a probe at a DUT, and adjust a pressure of the probe at the DUT 106, for example. The tool control application 110 may further assemble data files and transmit the data files over an interface to a storage location 130 or user interface 122. In various embodiments, the tool control application 110 may control the selection of DUTs 106 for testing or for retesting. Based on obtained measurement data, the tool control application 110 may select a DUT 106 for further testing, data collection, characterization tests, etc. The tool control application 110 may further select a specific program for running at the device test program 108.

In various embodiments, control of a behavior of the test cell 100 is enabled by communication between data sniffer 114, adaptive-test rule engine 118 and tool control application 110. Exemplary data sniffer 114 intercepts or extracts test data that is generated by the device test program 108. In various embodiments, the data sniffer 114 may extract the test data as soon as it is generated, i.e., in real time. The test data may be sent from the data sniffer 114 to the adaptive-test rule engine 118 for analysis. The adaptive-test rule engine 118 analyzes the received test data and determines one or more adaptation commands that may be implemented. The adaptive-test rule engine 118 may evaluate the test data with respect to various rules, algorithms and configuration data supplied to the adaptive-test rule engine 118. The adaptation commands may also be referred to as requests or directives. The adaptation commands may be related to the running of the device test program 108. Alternately, the adaptation commands may be related to a behavior of the test cell 100. The adaptation commands are sent from the adaptive-test rule engine 118 to the tool control application 110. When the adaptation command is related to the device test program 108, the tool control application 110 may send the adaptation command to the device test program 108 to be implemented therein. Otherwise, the tool control application 110 may implement the adaptation command itself so as to affect the tool cell behavior.

Exemplary adaptation commands for affecting the behavior are discussed below. When devices are being retested based on results observed in a prior test, an adaptation command may be applied to stop the retesting of certain DUTs 106 when it is determined that the test is not recovering any previously-failed devices. The adaptation command may cause tests in which the DUTs 106 pass with a certain regularity to be disabled, discontinued, or applied only on a subset of the DUTs 106. The adaptation command may also dynamically adjust applied condition settings or test limit values with a test program. The adaptation command may cause additional tests to be applied to a DUT 106 when an abnormal condition or test result is detected. An adaptation command may direct the tool control application 110 to wait for operator instruction based on analysis of data not available to the tool control application 110. Another adaptation command may direct the tool control application 110 to modify a strategy for characterizing a sample of DUTs 106. Another adaptation command may direct the tool control application 110 to control the handler 104 to perform various functions, such as cleaning of wafer probes or adjusting a probe pressure with respect to the DUT 106, for example. Another exemplary adaptation command may direct the tool control application 110 to alter a method of stepping through a test sample of DUTs 106. The step plan may be based on test results and/or analysis of test results on nearest neighbor DUTs or DUTs within a selected proximity to the DUT. Adaptation commands may be based on various parameters, such as sort counts, statistical analysis of parametric values, pass/fail counts, correlations among parametric test values, for example. The adaptation command is generally determined using rules, algorithms and configuration data related to the product type, a selected test pass, a manufacturing or engineering session or other parameter.

In one embodiment, the adaptive-test rule engine 118 makes the tool control application 110 aware of active adaptive testing. Separation of the adaptive-test rule engine 118 from the tool control application 110 allows flexibility in the supervision of the device test program 108 and operation of the test cell 100. For example, since the tool control application is an independent program from the adaptive-test rule engine 118, the tool control application 110 may reinstate a test which has been disabled by an adaptation command provided by the adaptive-test rule engine 118. This flexibility enables the device test program 108 to test and characterize DUTs 106 in a time-saving manner.

The adaptive-test rule engine may also take advantage of various functions performed by the tool control application 110. For example, the tool control application 110 manages and transmits data files as well as inserting new data records into the data files. The adaptive-test rule engine 118 may therefore use the tool control application 110 to inject into the data records various setup information and the adaptation commands that are implemented during testing. The history of the adaptive testing may therefore become an integral part of the test data associated with a DUT 106, thereby allowing for a greater interpretation of the test data. In another function, the tool control application 110 may send events to an external dashboard application, which in turn may generate notifications in various forms for subscribing users. The adaptive-test rule engine 118 may therefore use the tool control application 110 to inform operators or manufacturing personal about significant situations such as setup errors, alarms, etc.

Figure 2:
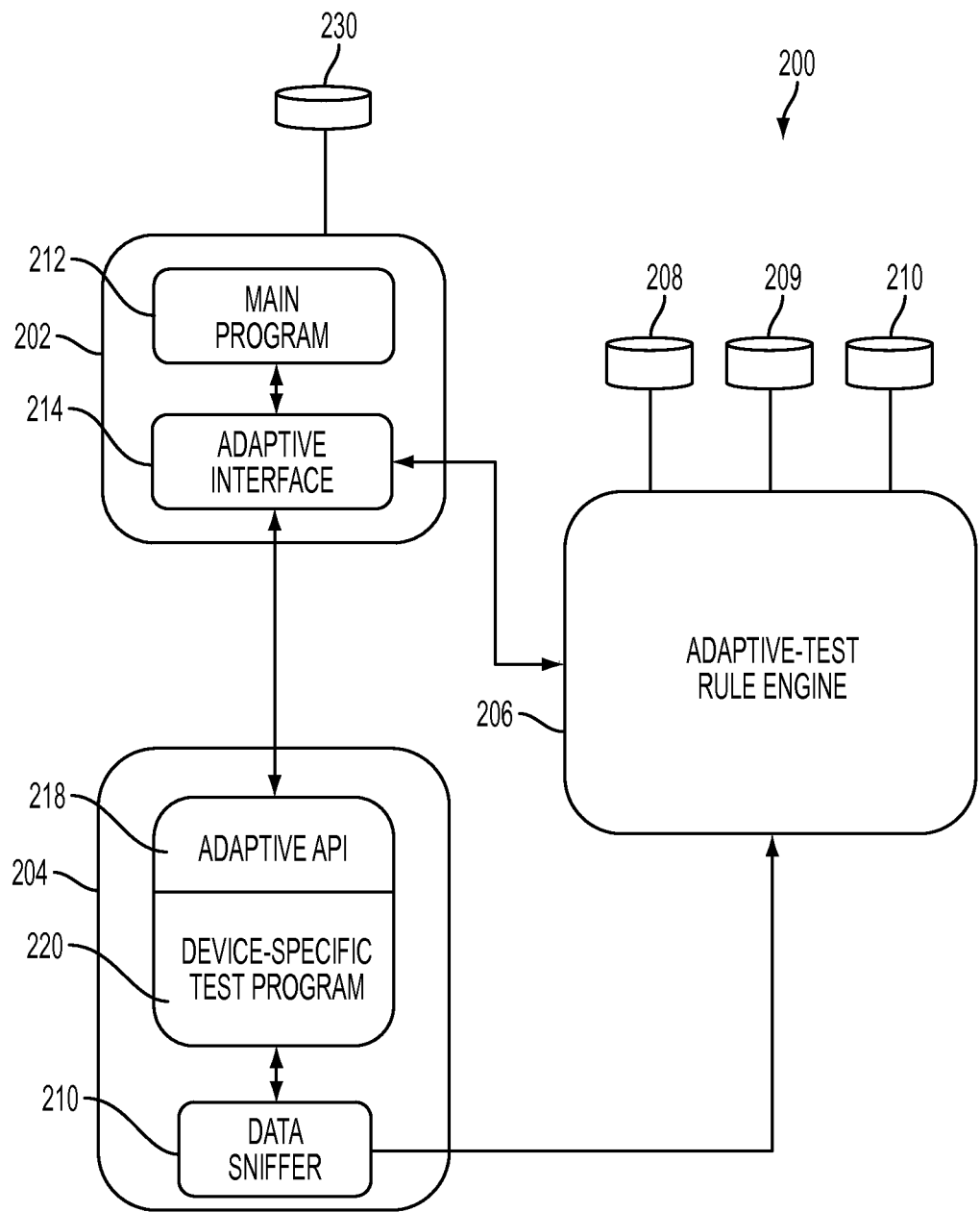
FIG. 2 shows an exemplary schematic drawing of an alternate embodiment of the test cell.

FIG. 2 shows an exemplary schematic drawing of an alternate embodiment of the test cell 200. The test cell 200 includes the tool control application 202, the device test program 204 and the adaptive-test rule engine 206. The tool control application 202 may include a main program 212 for performing functions of the tool control application 202 and an adaptive interface 214. The device test program 204 includes at least a device-specific test program 220 and a data sniffer 210. The device-specific test program 220 includes an adaptive API 218. The adaptive interface 214 provides a first interface to the adaptive API 218 of the device test program 204 that provides a direct communication link between the tool control application 202 and the device testing program 204. Adaptation commands are sent from the tool control application to the device testing program 204 over the first interface. The tool control application 202 includes a second interface with the adaptive-test rule engine 206 for data communication. In one embodiment, the tool control application receives adaptation commands and/or directives from the adaptive-test rule engine 206 through this second interface. The tool control application may further include a third interface for sending data for to a storage location 230.

The adaptive-test rule engine 206 is shown coupled to various rules databases 208, configuration files 209 and algorithms database 210. Entries in the rules database 208 are generally device-specific and may be supplied to the adaptive-test rule engine 206 when the specific device is under test. The configuration database 209 customizes the adaptive-test engine to run on a particular tester and communicate with the tool control application 202 and data sniffer 210 components on that tester. The algorithms database 210 supplies implementations of generic adaptive-test strategies or techniques; information from the product-specific rules database entry 208 selects which algorithms to apply and customizes their behavior for a particular product. Thus, in various embodiments, the adaptive-test rule engine 206 is an open system and the rules, configurations and algorithms may be dynamically loaded into the adaptive-test rule engine 206. New algorithms and rules may be implemented and installed into the system without having to make changes to the underlying adaptive-test rule engine 206. Thus, rules development, etc., may be kept separate from maintenance of the adaptive-test rule engine 206. Keeping product-specific settings separate from the rules and algorithms, etc., increases test cell flexibility and promotes development of reusable techniques which may more easily be extended to multiple products. The adaptive-test rule engine 206 may use network transactions to access long-term data storage either directly or via the tool control application 202.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

While exemplary embodiments of the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A method of testing a device under test (DUT), comprising:
providing a circuit tester that includes a tool control application and a device testing program;
providing a communication between the tool control application and a user interface;
using a handler to provide an interface between the circuit tester and the DUT, wherein the tool control application coordinates an operation of the handler and the device testing program;
testing the DUT using the device testing program of the circuit tester;
using a data sniffer to intercept test results as they are generated by the device testing program and forward the test results to a real-time rule engine;
determining an adaptation command for testing the device at the real-time rule engine using the test results;
sending the adaptation command from the real-time rule engine to a tool control application of the circuit tester, wherein the tool control application implements the adaptation command and separately supervises the operation of the circuit tester;
using the adaptation command at the tool control application to customize a behavior of the tool control application for a particular DUT; and
testing the DUT using the customized behavior.

2. The method of claim 1, wherein the adaptation command further comprises at least one of: initiating a test; discontinuing a test; pausing a test; and restarting a test.

3. The method of claim 1, further comprising using the adaptation command at the tool control application to alter a parameter related to a behavior of the device testing program.

4. The method of claim 3, wherein the adaptation command further comprises at least one of: selecting the DUT; coupling a probe to the DUT; cleaning a probe; compiling data; storing data; communicating data to a user interface; and obtaining instructions from a user at the user interface.

5. The method of claim 1, further comprising dynamically loading one or more testing rules into the adaptive testing engine, wherein the one or more testing rules are specific to the DUT.

6. The method of claim 1, wherein the DUT further comprises a wafer selected from a plurality of wafers, further comprising determining a testing order of the plurality of wafers.

7. The method of claim 1, further comprising storing the adaptation command with test data obtained using the adaptation command.

8. The method of claim 1, further comprising using the tool control application to reinstate a test which has been disabled by an adaptation command provided by the real-time rule engine.

9. The method of claim 1, wherein customizing a behavior further comprises customizing an activity of the handler.

\* \* \* \* \*